United States Patent
Geschke et al.

(10) Patent No.: US 7,180,751 B1
(45) Date of Patent: Feb. 20, 2007

(54) INPUT/OUTPUT TRANSITION BOARD SYSTEM

(75) Inventors: Gregory S. Geschke, Spokane, WA (US); William C. Gustafson, Moscow, ID (US); Alan B. Roberts, Moscow, ID (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 267 days.

(21) Appl. No.: 10/783,397

(22) Filed: Feb. 19, 2004

(51) Int. Cl.
*H01R 12/16* (2006.01)

(52) U.S. Cl. .................. 361/788; 361/758; 361/792; 361/804

(58) Field of Classification Search .............. 361/735, 361/742, 758, 770, 788, 790, 792, 804
See application file for complete search history.

(56) References Cited

U.S. PATENT DOCUMENTS

| | | | | |
|---|---|---|---|---|
| 4,689,721 A | * | 8/1987 | Damerow et al. | 361/707 |
| 4,876,630 A | | 10/1989 | Dara | 361/413 |
| 4,953,058 A | | 8/1990 | Harris | 361/383 |
| 5,023,754 A | | 6/1991 | Aug et al. | 361/415 |
| 5,348,482 A | | 9/1994 | Rudy, Jr. et al. | 439/61 |
| 5,388,995 A | | 2/1995 | Rudy, Jr. et al. | 439/61 |
| 5,488,541 A | | 1/1996 | Mistry et al. | 361/788 |
| 5,519,573 A | | 5/1996 | Cobb et al. | 361/686 |
| 5,575,686 A | * | 11/1996 | Noschese | 439/620 |
| 5,650,911 A | | 7/1997 | Scholder et al. | 361/684 |
| 5,687,577 A | | 11/1997 | Ballard et al. | 62/64 |
| 5,707,242 A | * | 1/1998 | Mitra et al. | 439/74 |
| 5,825,621 A | | 10/1998 | Giannatto et al. | 361/701 |
| 5,831,824 A | | 11/1998 | McDunn et al. | 361/699 |
| 5,835,349 A | | 11/1998 | Giannatto et al. | 361/701 |
| 5,880,931 A | | 3/1999 | Tilton et al. | 361/690 |
| 5,907,473 A | | 5/1999 | Przilas et al. | 361/699 |
| 5,926,378 A | | 7/1999 | DeWitt et al. | 361/788 |
| 5,943,211 A | | 8/1999 | Havey et al. | 361/699 |
| 5,982,619 A | | 11/1999 | Giannatto et al. | 361/701 |
| 5,986,887 A | * | 11/1999 | Smith et al. | 361/704 |
| 6,049,467 A | * | 4/2000 | Tamarkin et al. | 361/790 |
| 6,067,226 A | | 5/2000 | Barker et al. | 361/686 |
| 6,109,929 A | * | 8/2000 | Jasper | 439/74 |
| 6,139,361 A | * | 10/2000 | Przilas et al. | 439/559 |
| 6,144,561 A | * | 11/2000 | Cannella et al. | 361/796 |
| 6,186,798 B1 | | 2/2001 | Follingstad et al. | 439/76.1 |
| 6,345,986 B1 | | 2/2002 | Follingstad et al. | 439/64 |
| 6,362,974 B1 | * | 3/2002 | Lettang | 361/790 |
| 6,394,815 B1 | | 5/2002 | Sarno et al. | 439/61 |
| 6,477,593 B1 | * | 11/2002 | Khosrowpour et al. | 710/100 |
| 6,549,400 B1 | | 4/2003 | Medin et al. | 361/686 |

(Continued)

FOREIGN PATENT DOCUMENTS

WO     WO 01/01741     1/2001

*Primary Examiner*—Tran Dinh
*Assistant Examiner*—Hung S. Bui
(74) *Attorney, Agent, or Firm*—Michael S. Neustel (57) ABSTRACT

An input/output transition board system for collecting and distributing input/output signals between a backplane board and an I/O board while allowing for additional electronic devices. The input/output transition board system includes a transition board having at least one front connector and at least one rear connector. The front connector is connectable to a corresponding rear panel connector within a backplane board. The rear connector is connectable to a corresponding front I/O connector of an I/O board. The transition board collects and passes the signals between the I/O board and the backplane board. The transition board is also preferably active with additional electronic devices connected to the transition board.

14 Claims, 10 Drawing Sheets

U.S. PATENT DOCUMENTS

| | | | |
|---|---|---|---|
| 6,623,278 B2 | 9/2003 | Follingstad et al. | 439/64 |
| 6,625,023 B1 | 9/2003 | Morrow et al. | 361/700 |
| 6,639,795 B1 | 10/2003 | Cooper | 361/692 |
| 6,657,871 B2 * | 12/2003 | Perino et al. | 361/760 |
| 6,731,514 B2 * | 5/2004 | Evans | 361/790 |
| 6,822,874 B1 * | 11/2004 | Marler | 361/752 |
| 6,945,795 B1 * | 9/2005 | Gross, III et al. | 439/92 |
| 2005/0047079 A1 * | 3/2005 | Gasbarro et al. | 361/686 |
| 2005/0251035 A1 * | 11/2005 | Wong et al. | 600/437 |

* cited by examiner

INPUT/OUTPUT TRANSITION BOARD SYSTEM

STATEMENT REGARDING FEDERALLY SPONSORED RESEARCH OR DEVELOPMENT

This invention was made with Government support under Contract No. N68335-00-D-0451 awarded by Naval Air Systems Command. The Government has certain rights in this invention.

CROSS REFERENCE TO RELATED APPLICATIONS

Not applicable to this application.

BACKGROUND OF THE INVENTION

1. Field of the Invention

The present invention relates generally to input/output (I/O) boards and more specifically it relates to an input/output transition board system for collecting and distributing input/output signals between a backplane and an I/O board while allowing for additional electronic devices.

2. Description of the Related Art

Conventional backplanes have been in use for years upon various electronic units. Backplanes typically include a plurality of sockets that receive a corresponding number of cards. Some backplanes include a plurality of rear panel connectors that are in direct communication with the sockets. Exemplary backplane technologies include VME (VersaModule Eurocard), PCI (Peripheral Component Interconnect), cPCI (compact PCI) and related backplane technologies.

In thermal management applications (e.g. spray cooling, air cooling), an enclosure surrounds the electronic devices being thermally managed. I/O connectors are required to allow for the connection of external electronic devices. The I/O connectors are typically directly wired to the backplane with numerous wires (not shown). There are typically hundreds and sometimes thousands of wires required for all of the I/O connectors (each I/O connector typically has between 10–150 contacts). This wire configuration is time consuming to make and install. In addition, the wire configuration does not provide reliable impedance and is prone to failure (e.g. solder breakage, wire abrasion). Also, the wire configuration requires a significant amount of space within the enclosure.

Figure 1:
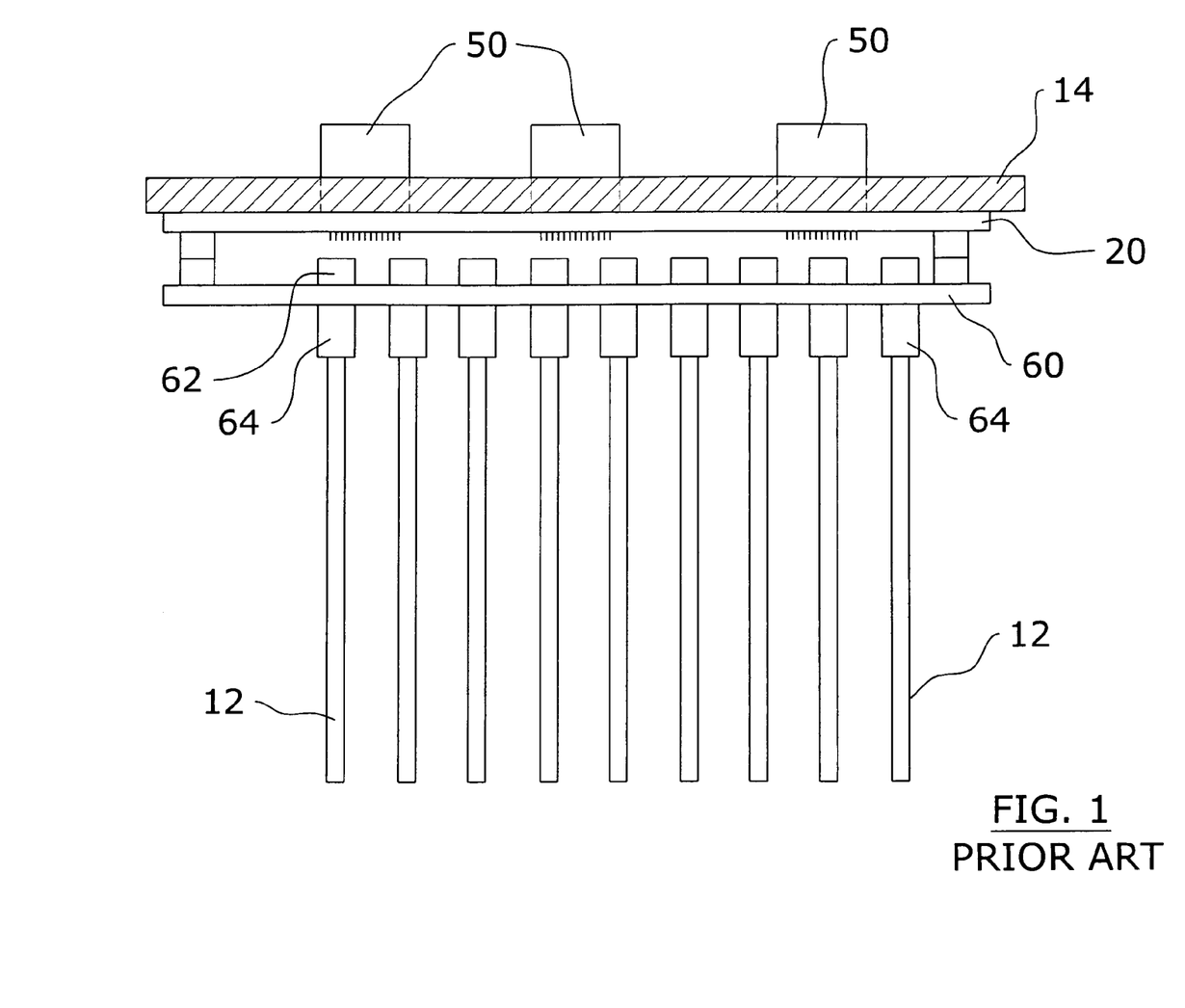
FIG. 1 is a top view illustrating an exemplary prior art backplane connected to an I/O board.
Figure 2:
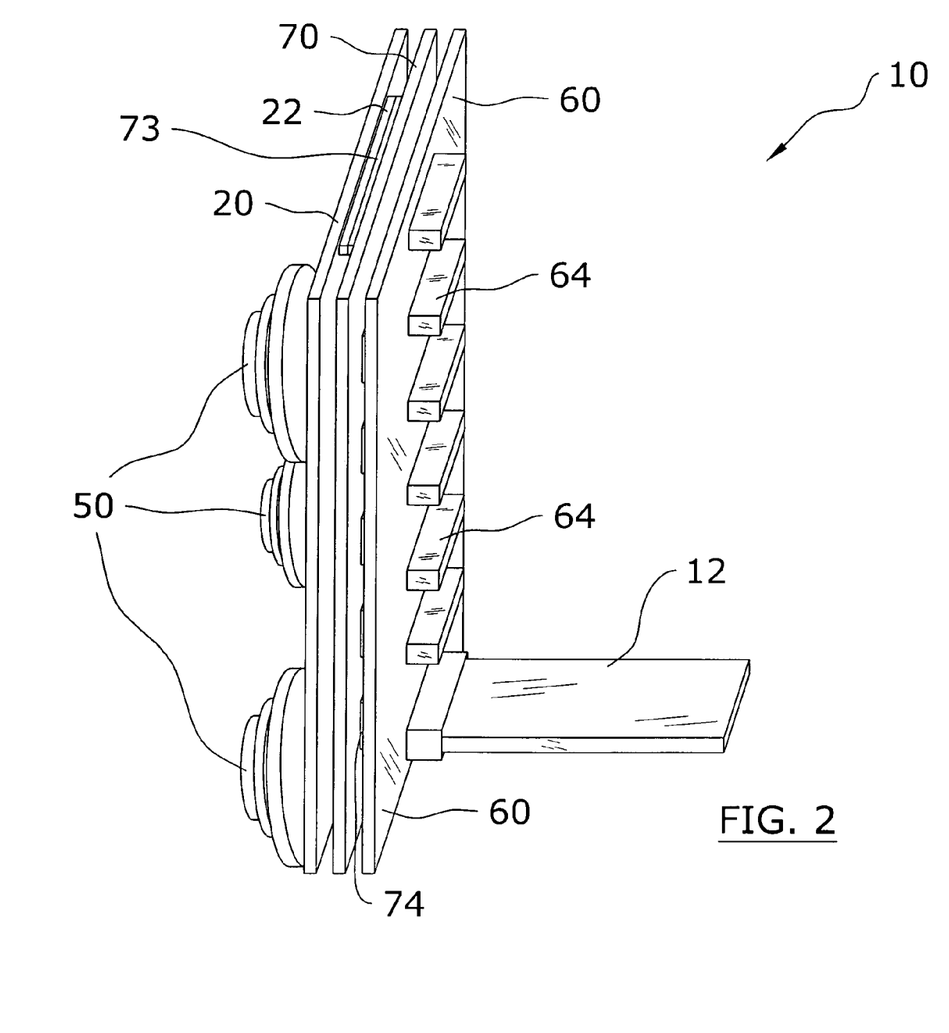
FIG. 2 is an upper perspective view of the present invention.

To solve the inherent problems with wire configurations, ISOTHERMAL SYSTEMS RESEARCH, INC. developed an I/O board that is in direct communication between the I/O connectors and a backplane as shown in FIG. 1 of the drawings. This configuration eliminates the usage of numerous wire connections between the I/O connectors and the backplane. However, there is a need for additional electronic devices and functionality to be included within the enclosure without significantly increasing the size of the enclosure (e.g. transceivers, Ethernet physical layer, current limiters, power sources, individual resets for selected backplane slots).

While these devices may be suitable for the particular purpose to which they address, they are not as suitable for collecting and distributing input/output signals between a backplane and an I/O board while allowing for additional electronic devices. Conventional electronic communication systems for I/O connectors and a backplane do not allow for additional electronic devices and functionality.

In these respects, the input/output transition board system according to the present invention substantially departs from the conventional concepts and designs of the prior art, and in so doing provides an apparatus primarily developed for the purpose of collecting and distributing input/output signals between a backplane and an I/O board while allowing for additional electronic devices.

BRIEF SUMMARY OF THE INVENTION

In view of the foregoing disadvantages inherent in the known types of backplane and I/O board connections now present in the prior art, the present invention provides a new input/output transition board system construction wherein the same can be utilized for collecting and distributing input/output signals between a backplane and an I/O board while allowing for additional electronic devices.

The general purpose of the present invention, which will be described subsequently in greater detail, is to provide a new input/output transition board system that has many of the advantages of the backplane and I/O board connections mentioned heretofore and many novel features that result in a new input/output transition board system which is not anticipated, rendered obvious, suggested, or even implied by any of the prior art backplane and I/O board connections, either alone or in any combination thereof.

To attain this, the present invention generally comprises a transition board having at least one front connector and at least one rear connector. The front connector is connectable to a corresponding rear panel connector within a backplane. The rear connector is connectable to a corresponding front I/O connector of an I/O board. The transition board collects and passes the signals between the I/O board and the backplane. The transition board is also preferably active with additional electronic devices connected to the transition board.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide an input/output transition board system that will overcome the shortcomings of the prior art devices.

A second object is to provide an input/output transition board system for collecting and distributing input/output signals between a backplane and an I/O board while allowing for additional electronic devices.

Another object is to provide an input/output transition board system that allows for attachment of accessory devices such as but not limited to transceivers, voltage and current regulators, filters, receivers, transmitters, port monitors and the like.

An additional object is to provide an input/output transition board system that significantly reduces the usage of discrete wiring.

A further object is to provide an input/output transition board system that provides reliable impedance and communications.

Another object is to provide an input/output transition board system that is resistant to communication disruption.

A further object is to provide an input/output transition board system that is efficient and economical to manufacture and assemble.

Another object is to provide an input/output transition board system that minimizes the required size of an enclosure.

A further object is to provide an input/output transition board system that allows for the usage of commercial off the shelf cards and backplane boards.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Turning now descriptively to the drawings, in which similar reference characters denote similar elements throughout the several views, FIGS. 2 through 10 illustrate an input/output transition board system 10, which comprises a transition board 70 having at least one front connector 72 and at least one rear connector 73. The front connector 72 is connectable to a corresponding rear panel connector within a backplane. The rear connector 73 is connectable to a corresponding front I/O connector 22 of an I/O board 20. The transition board 70 collects and passes the signals between the I/O board 20 and the backplane. The transition board 70 is also preferably active with additional electronic devices 74 connected to the transition board 70. The I/O board 20, the transition board 70 and the backplane board 60 are preferably substantially parallel to one another in order to reduce the size necessary for the enclosure 14.

B. Enclosure

Figure 4:
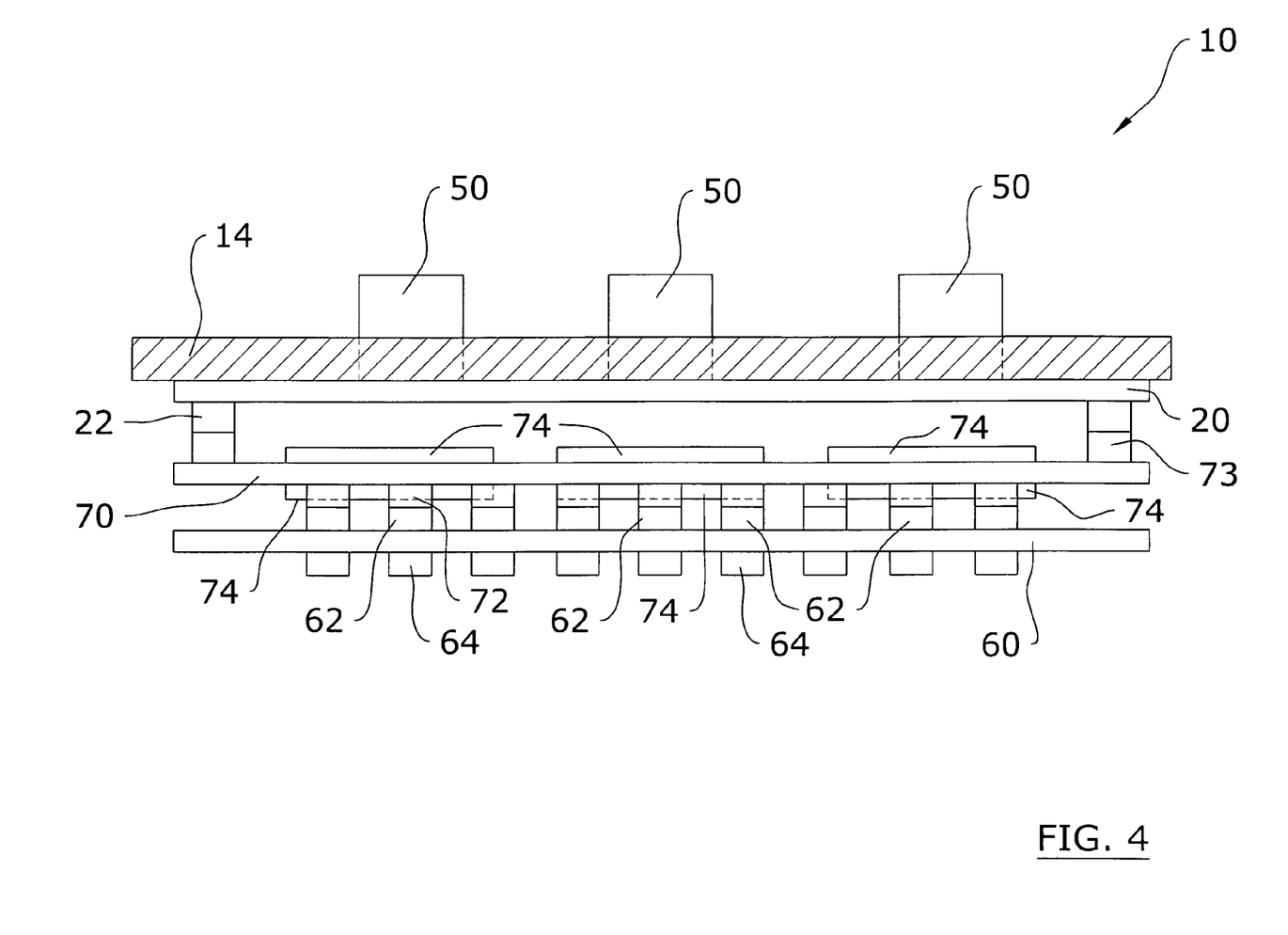
FIG. 4 is a top view of the present invention.
Figure 5:
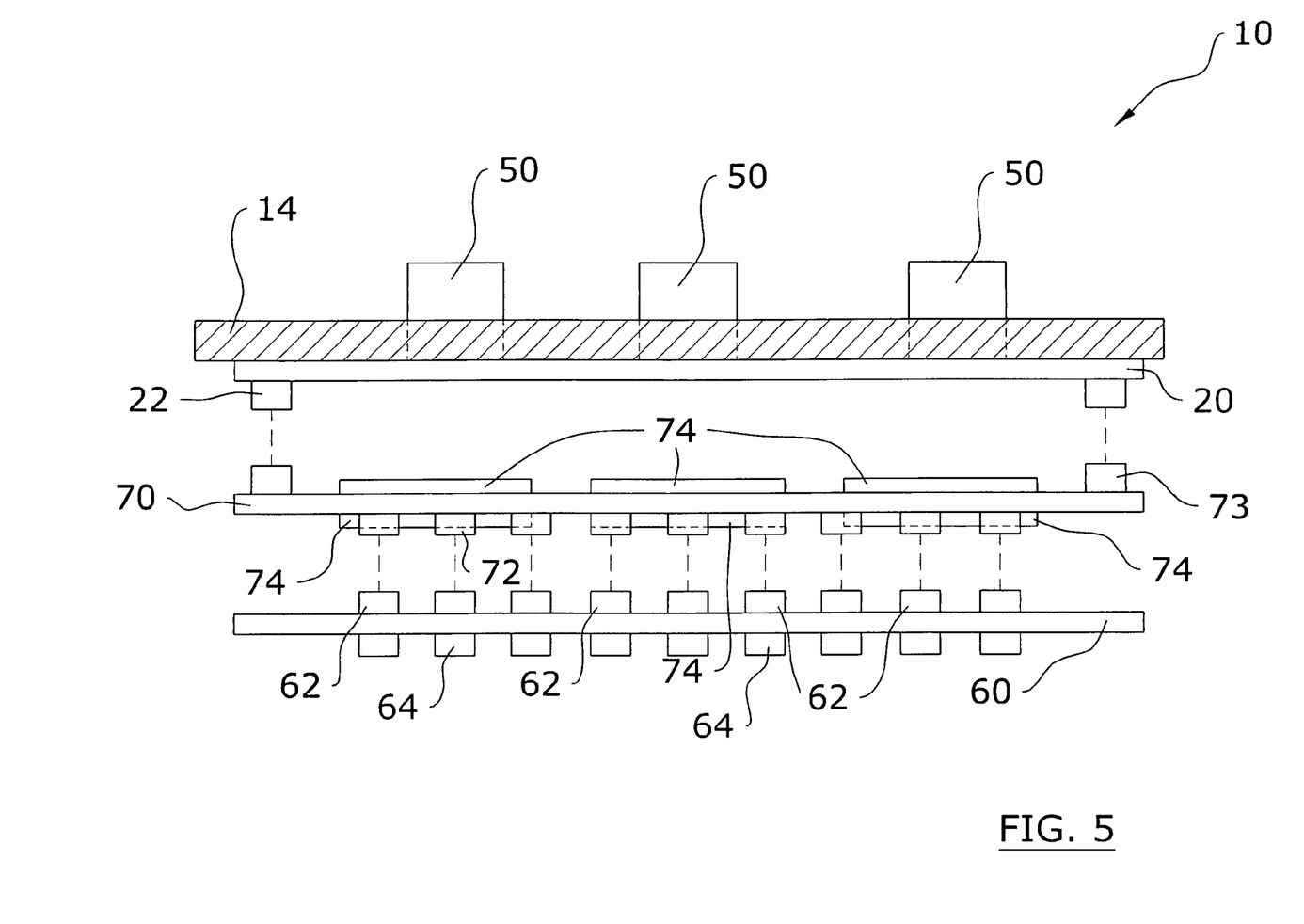
FIG. 5 is an exploded top view of the present invention.
Figure 6:
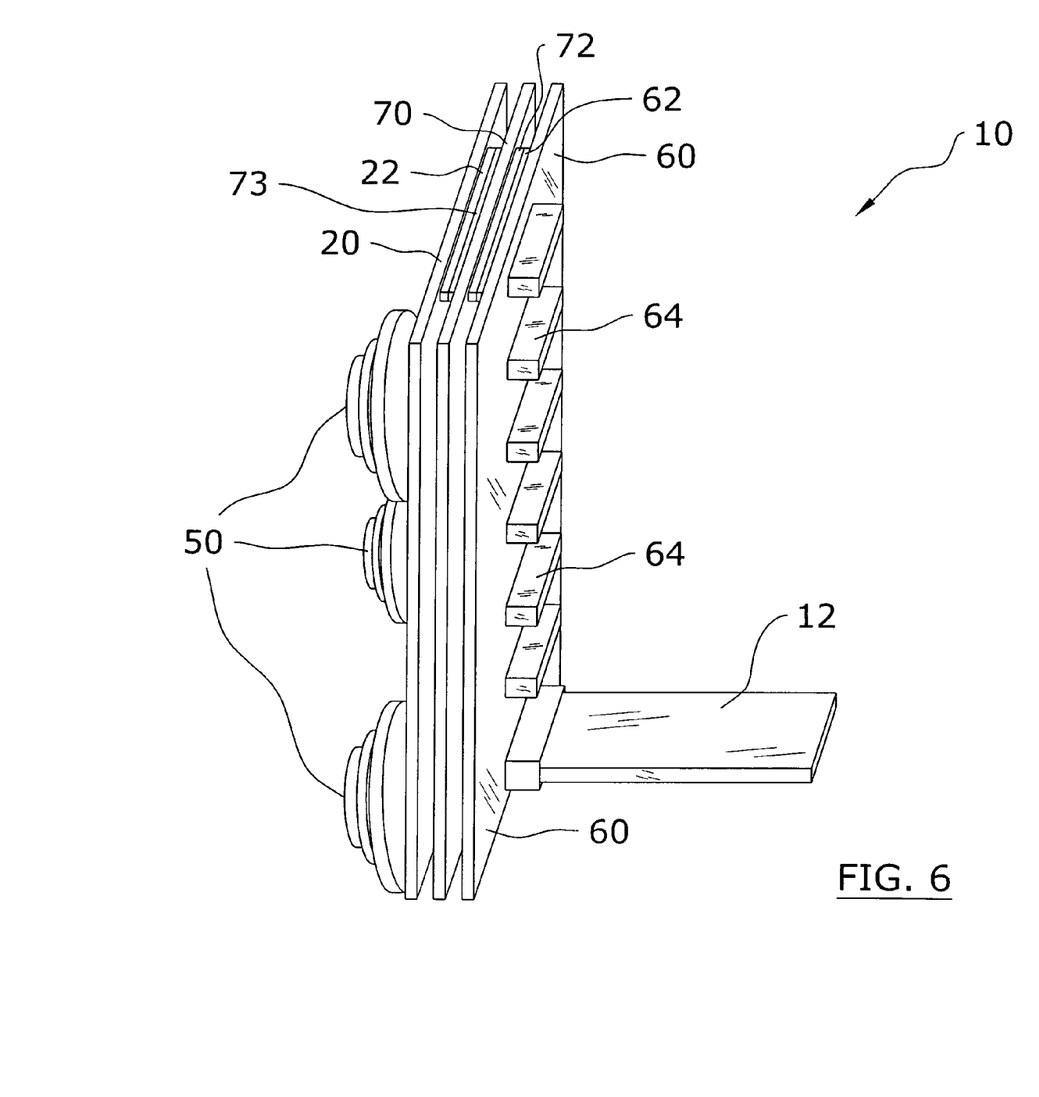
FIG. 6 is an upper perspective view of an alternative embodiment of the present invention.
Figure 7:
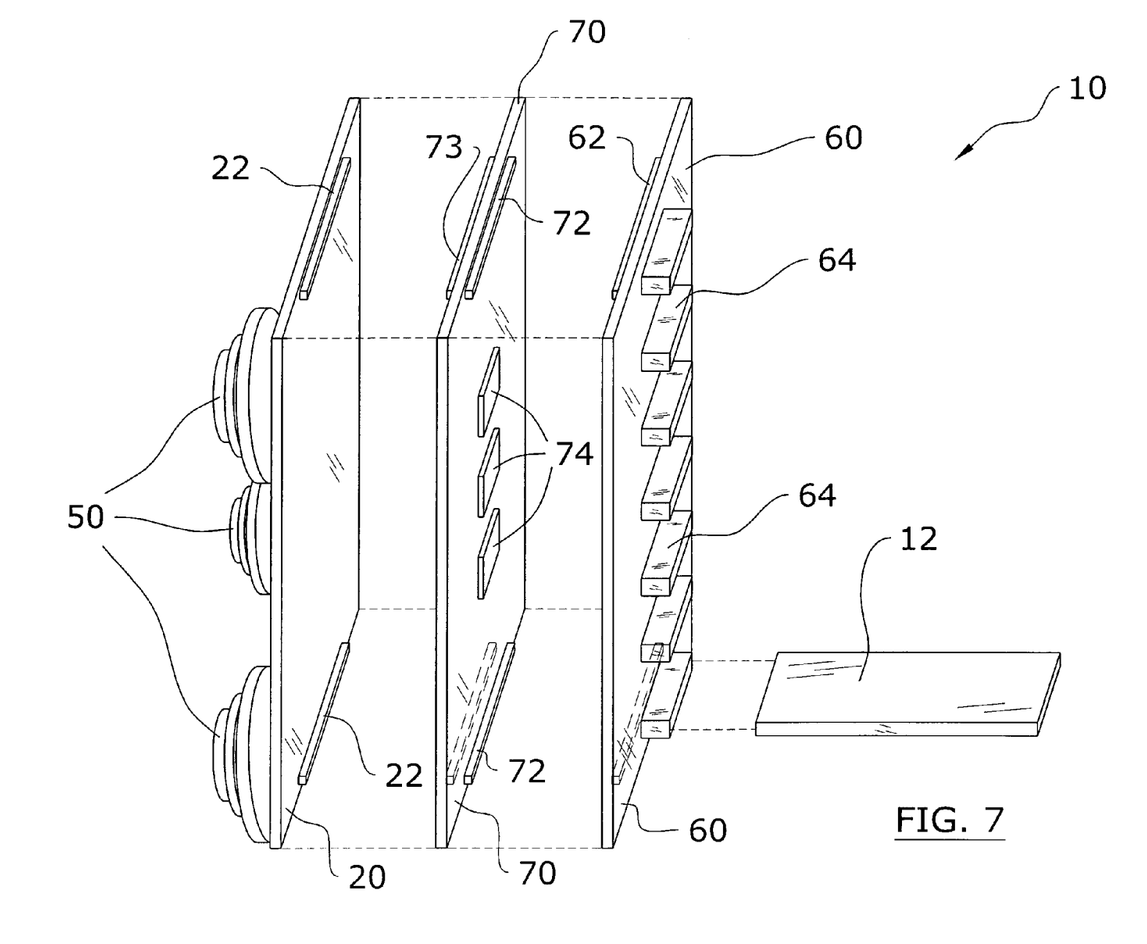
FIG. 7 is an exploded upper perspective view of the alternative embodiment.

An enclosure 14 preferably surrounds the I/O board 20, the transition board 70 and the backplane board 60 along with the cards 12 connected to the backplane board 60. The I/O connectors are extendable through a wall of the enclosure 14 as best illustrated in FIGS. 4 and 5 of the drawings. In addition, the I/O board 20 preferably attached to an inner surface of the enclosure 14 as further shown in FIGS. 4 and 5 of the drawings.

A card cage may be utilized within the enclosure 14 to support the cards 12 as is well known in the art. U.S. Pat. No. 5,880,931 illustrates an exemplary card cage for enclosures 14 and is incorporated by reference.

The enclosure 14 may be comprised of various structures commonly utilized to retain electronics. The enclosure 14 may be comprised of air-cooled, liquid cooled or spray cooled structures which are well known in the art. The enclosure 14 may be comprised of a sealed or non-sealed structure.

C. I/O Board

The I/O board 20 may be comprised of any conventional I/O board 20 capable of transferring communications which are well known in the art. The I/O board 20 is preferably attachable to an interior surface of an enclosure 14 as shown in FIGS. 4 and 5 of the drawings. The I/O board 20 may be distally spaced from the inner surface of the enclosure 14, however this distance is preferably less than 1.0 inch.

Figure 3:
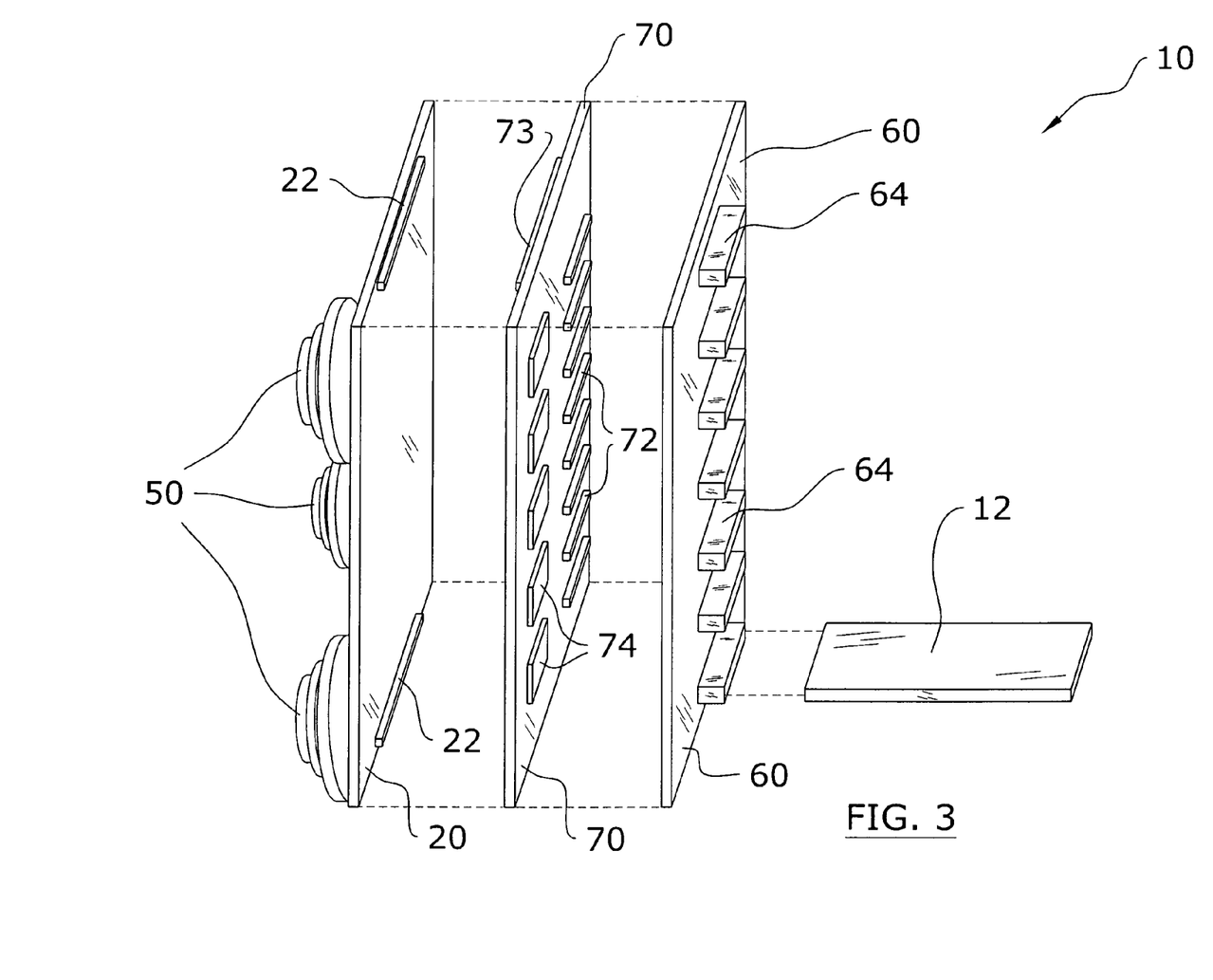
FIG. 3 is an exploded upper perspective view of the present invention.

The I/O board 20 has one or more rear I/O connectors 50 that provide an electrical communications pathway into the interior of the enclosure 14 as illustrated in FIGS. 3, 4 and 5 of the drawings. The rear I/O connectors 50 are preferably hermetic and extend through a wall of the enclosure 14 in a sealed manner as further shown in FIGS. 4 and 5 of the drawings. Each of the rear I/O connectors 50 preferably includes at least about 10–150 electrical conductors; however the rear I/O connectors 50 may have less than 10–150 electrical conductors.

As shown in FIGS. 2 through 10 of the drawings, one or more front I/O connectors 22 are connected to the I/O board 20 for transferring communications from the I/O board 20 to the transition board 70. The front I/O connectors 22 may be positioned in various locations upon the side of the I/O board 20 opposite of the I/O connectors. It is preferable to first determine the positions of the rear I/O connectors 50 upon the I/O board 20 before determining the locations of the front I/O connectors 22. It is also possible to have the front I/O connectors 22 positioned on opposite ends of the I/O board 20 to provide a central space with respect to the transition board 70 to allow space for accessory devices 74 as shown in FIGS. 3 through 5 of the drawings.

In addition, a space between the I/O board 20 and the transition board 70 also provides room for solder connections with the rear I/O connectors 50. The solder connections may be comprised of a socket type structure that receive pins from the I/O connectors 50.

The front I/O connectors 22 and the rear I/O connectors 50 are preferably comprised of a high density connector structure having a plurality of electrical conductors (e.g. male, female). The front I/O connectors 22 and the rear I/O connectors 50 are electrically connected to circuits within the I/O board 20 for transferring the data between the rear I/O connectors 50 and the front I/O connectors 22.

D. Transition Board

The transition board 70 provides additional space for the addition of accessory devices 74 between the I/O board 20 and the backplane board 60. The transition board 70 may be comprised of any conventional circuit board structure. The transition board 70 is also preferably active since the purpose of the transition board 70 is to not only transfer data between the backplane board 60 and the I/O board 20, but to also manipulate, monitor or modify this data midstream.

The transition board 70 includes one or more rear connectors 73 connected to the front I/O connectors 22 as shown in FIGS. 4 and 5 of the drawings. The rear connectors 73 are comprised of a connector structure similar to the front I/O connectors 22 and are positioned upon the transition board 70 in order to align with the I/O connectors. As can be appreciated, the connectors 22, 32, 62, 72, 73 may be comprised of any connector structure capable of transferring electrical communications.

The transition board 70 further includes one or more front connectors 72 connected to the rear backplane connectors 62 of the backplane board 60 as shown in FIGS. 4 and 5 of the drawings. The front connectors 72 are comprised of a connector structure similar to the rear backplane connectors 62 and are positioned upon the transition board 70 in order to align with the rear backplane connectors 62.

The rear connectors 73 and the front connectors 72 of the transition board 70 may be positioned in a spaced apart relationship to provide space for the accessory devices 74 positioned between thereof as shown in FIGS. 7, 8, 9 and 10 of the drawings. However, the front connectors 72 may be positioned near one another particularly if the backplane board 60 has a plurality of rear panel connectors as shown in FIGS. 3, 4 and 5 of the drawings.

Figure 8:
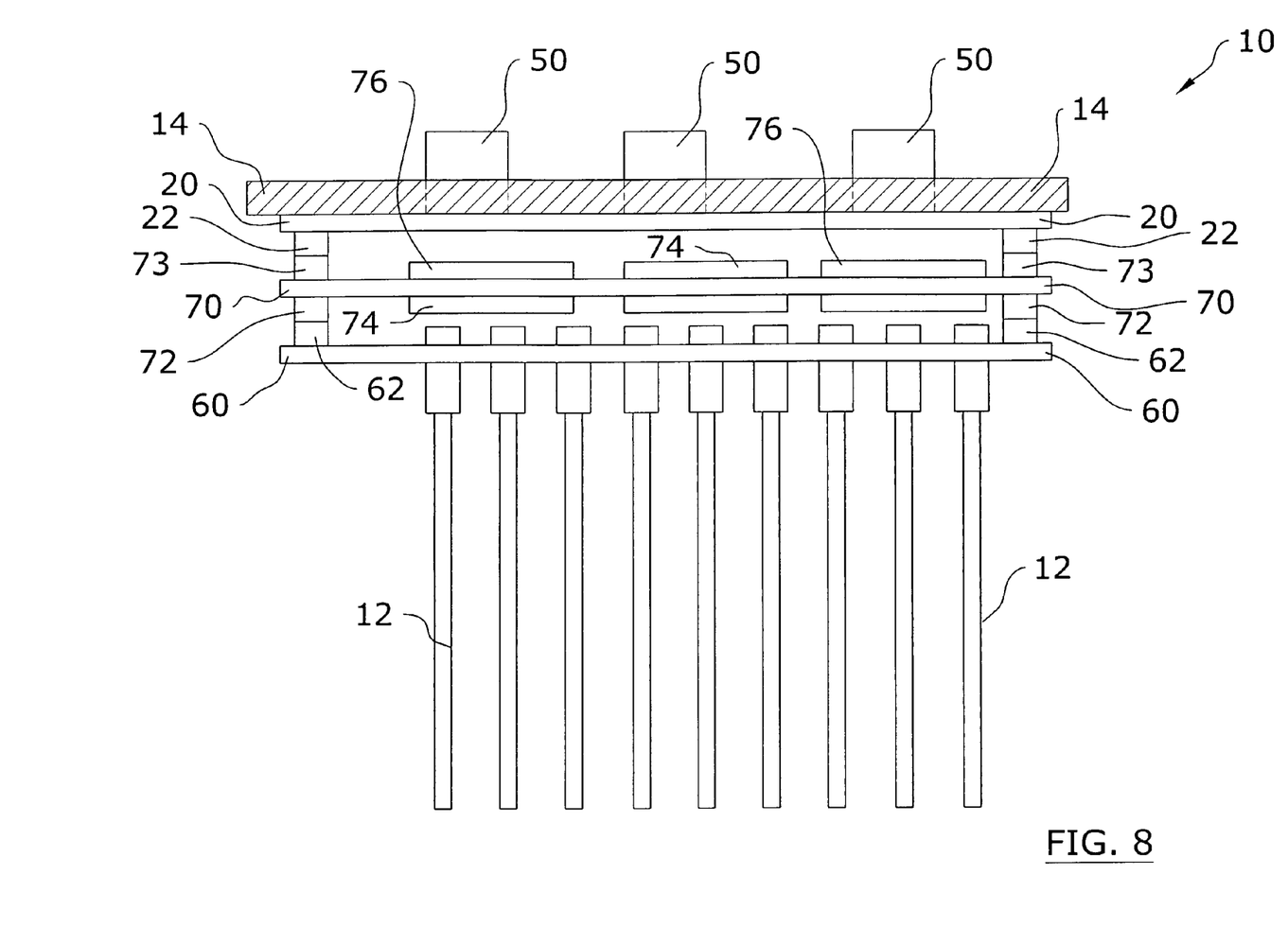
FIG. 8 is a top view of the alternative embodiment.
Figure 9:
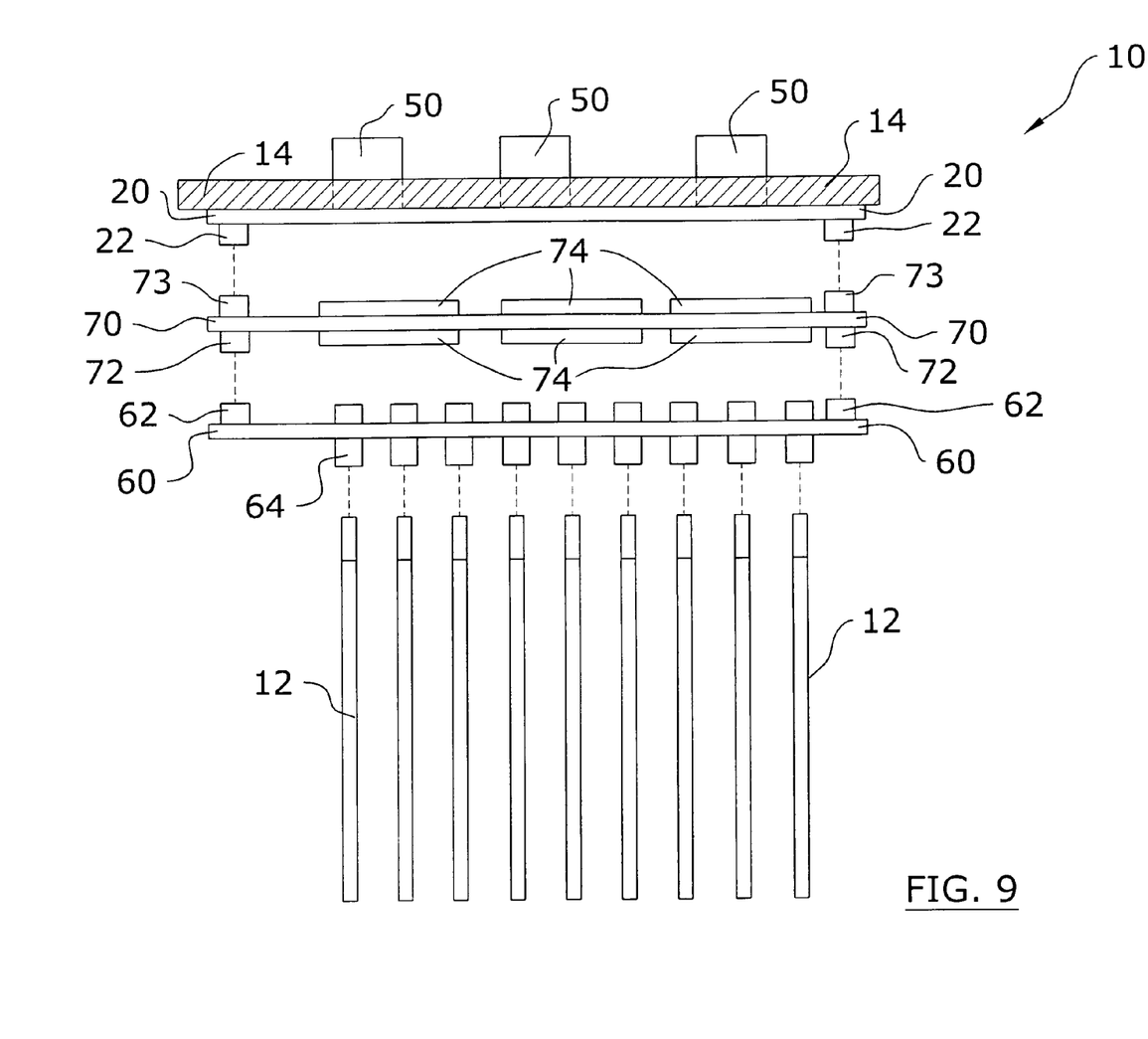
FIG. 9 is an exploded top view of the alternative embodiment.
Figure 10:
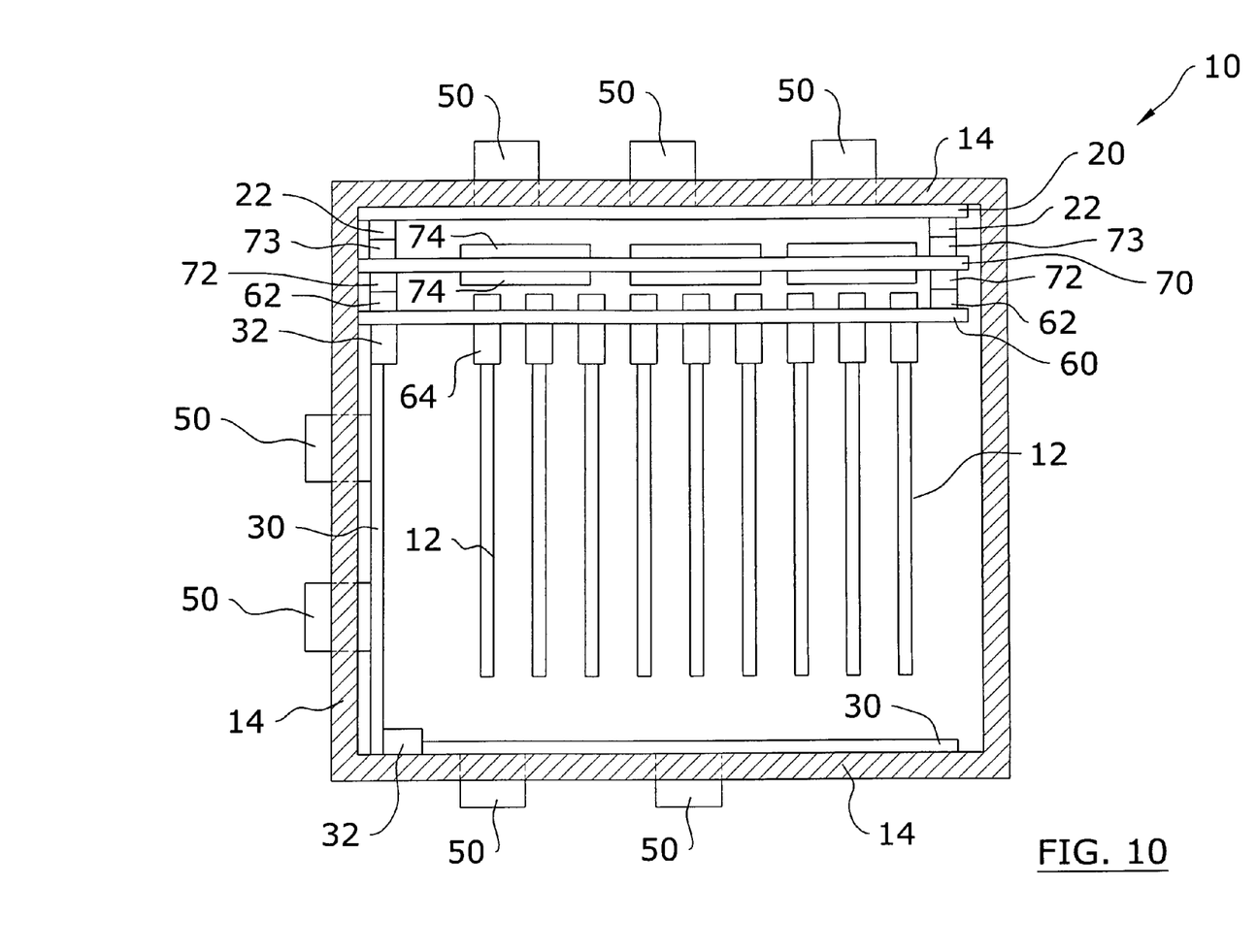
FIG. 10 is a top view of a second alternative embodiment of the present invention disclosing a plurality of auxiliary boards.

The transition board 70 is preferably distally spaced a distance from the backplane board 60 and a distance from the I/O board 20 as shown in FIGS. 4, 8 and 10 of the drawings. The distance is preferably between about 0.4 to 1.0 inch which provides sufficient space between the boards 20, 60, 70 to receive the one or more accessory devices 74 connected to the transition board 70.

The accessory devices 74 may be comprised of various electronic devices 74 such as but not limited to transceivers, receivers, transmitters, voltage regulators, current regulators, power sources, filters, port monitors, microprocessors, memory, crossbar switch for I/O assignment, and individual resets for selected backplane slots. The accessory devices 74 are electrically connected to circuits within the transition board 70. The accessory devices 74 may also manipulate data received from either the I/O board 20 or the backplane board 60.

E. Backplane Board

The backplane board 60 may be comprised of any conventional backplane board 60 configuration such as but not limited to VME (VersaModule Eurocard), PCI (Peripheral Component Interconnect), cPCI (compact PCI). The backplane board 60 has one or more rear backplane connectors 62 connected to the front connectors 72 of the transition board 70 as shown in FIGS. 4 and 5 of the drawings.

In addition, the backplane board 60 preferably has one or more sockets 64 for receiving one or more cards 12. The sockets 64 are on a side opposite of the rear backplane connectors 62 as shown in FIGS. 4 and 5 of the drawings. The sockets 64 are preferably in communication with the rear backplane connectors 62, where the rear backplane connectors 62 are comprised of a rear panel connector structure to allow for pass through communications between the sockets 64 and the rear backplane connectors 62.

F. Auxiliary Board

As shown in FIG. 10, at least one first auxiliary connector 32 is connected to the backplane board 60 for receiving a first auxiliary board 30. In addition, at least one second auxiliary connector 32 may be connected to the first auxiliary board 30 and a second auxiliary board 30 is connected to the second auxiliary connector 32. The auxiliary boards 30 may be comprised of any circuit board architecture and may include one or more electronic devices 74. The auxiliary boards 30 may also include I/O connectors that extend through the enclosure 14 as shown in FIG. 10 of the drawings. The auxiliary boards 30 may extend about the interior perimeter of the enclosure 14 as further shown in FIG. 10 of the drawings.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. An input/output transition board system for transferring data between an I/O board and a backplane board, comprising:
    an I/O board having at least one I/O connector and at least one front I/O connector;
    a transition board having at least one rear connector connectable to said at least one front I/O connector and at least one front connector; and
    a backplane board having at least one rear backplane connector connectable to said at least one front connector;
    an enclosure capable of receiving said I/O board, said transition board and said backplane board, wherein said enclosure is comprised of a spray cooling system;
    wherein said enclosure is sealed;
    wherein said transition board manipulates data being transferred between said I/O board and said backplane board;
    wherein said transition board includes at least one electronic device;
    wherein said transition board is active;
    wherein said backplane board has at least one socket;
    wherein said at least one socket is on a side opposite of said at least one rear backplane connector;
    wherein said at least one socket is in communication with said at least one rear backplane connector;
    wherein said I/O board is attachable to an interior surface of an enclosure;
    wherein said at least one I/O connector is extendable through a corresponding opening within said enclosure;
    wherein said at least I/O connector is hermetic.

2. The input/output transition board system of claim 1, wherein said transition board is distally spaced a distance from said backplane board when said at least one rear backplane connector is connected to said at least one front connector.

3. The input/output transition board system of claim 2, wherein said distance is at least about 0.4 inches.

4. The input/output transition board system of claim 2, wherein said distance is between about 0.4 to 1.0 inch.

5. The input/output transition board system of claim 1, wherein said rear backplane connector is comprised of a rear panel connector.

6. The input/output transition board system of claim 1, wherein said transition board is distally spaced a distance from said I/O board when said at least one front I/O connector is connected to said at least one rear connector.

7. The input/output transition board system of claim 6, wherein said distance is at least about 0.4 inches.

8. The input/output transition board system of claim 6, wherein said distance is between about 0.4 to 1.0 inch.

9. The input/output transition board system of claim 1, wherein said at least I/O connector includes at least about 250 electrical conductors.

10. The input/output transition board system of claim 1, wherein said I/O board, said transition board and said backplane board are substantially parallel to one another.

11. The input/output transition board system of claim 1, including at least one first auxiliary connector connected to said backplane board and a first auxiliary board connectable to said auxiliary connector.

12. The input/output transition board system of claim 11, including at least one second auxiliary connector connected to said first auxiliary board and a second auxiliary board connectable to said second auxiliary connector.

13. An input/output transition board system for actively transferring data between an I/O board and a backplane board, comprising:
    an I/O board having at least one I/O connector and at least one first connector;
    a transition board having at least one second connector connected to said at least one first connector and at least one third connector, wherein said transition board is active;
    at least one electronic device connected to said transition board;
    a backplane board having at least one fourth connector connected to said at least one third connector, wherein said backplane board has at least one socket capable of receiving at least one card;
    wherein said I/O board, said transition board and said backplane board are substantially parallel to one another; and
    an enclosure surrounding said I/O board, said transition board and said backplane board, wherein said at least one I/O connector extends through a wall of said enclosure, wherein said I/O board is at least near an inner surface of said enclosure;
    wherein said transition board is distally spaced a first distance from said backplane board when said at least one fourth connector is connected to said at least one third connector;
    wherein said first distance is at least about 0.4 inches;
    wherein said at least one socket is on a side opposite of said at least one fourth connector;
    wherein said at least one socket is in communication with said at least one fourth connector;
    wherein said fourth connector is comprised of a rear panel connector;
    wherein said transition board is distally spaced a second distance from said I/O board when said at least one first connector is connected to said at least one second connector;
    wherein said second distance is at least about 0.4 inches;
    wherein said at least I/O connector is hermetic;
    wherein said at least I/O connector includes at least about 250 electrical conductors;
    an enclosure capable of receiving said I/O board, said transition board and said backplane board, wherein said enclosure is comprised of a spray cooling system;
    wherein said I/O board, said transition board and said backplane board are substantially parallel to one another;
    at least one first auxiliary connector connected to said backplane board;
    a first auxiliary board connected to said auxiliary connector;
    at least one second auxiliary connector connected to said first auxiliary board;
    a second auxiliary board connected to said second auxiliary connector.

14. An input/output transition board system for actively transferring data between an I/O board and a backplane board, comprising:
    an I/O board having at least one I/O connector and at least one first connector;
    a transition board having at least one second connector connected to said at least one first connector and at least one third connector, wherein said transition board is active;
    at least one electronic device connected to said transition board;
    a backplane board having at least one fourth connector connected to said at least one third connector, wherein said backplane board has at least one socket capable of receiving at least one card;
    wherein said I/O board, said transition board and said backplane board are substantially parallel to one another; and
    an enclosure surrounding said I/O board, said transition board and said backplane board, wherein said at least one I/O connector extends through a wall of said enclosure, wherein said I/O board is at least near an inner surface of said enclosure;
    wherein said transition board is distally spaced a first distance from said backplane board when said at least one fourth connector is connected to said at least one third connector;
    wherein said first distance is at least about 0.4 inches;
    wherein said at least one socket is on a side opposite of said at least one fourth connector;
    wherein said at least one socket is in communication with said at least one fourth connector;
    wherein said fourth connector is comprised of a rear panel connector;
    wherein said transition board is distally spaced a second distance from said I/O board when said at least one first connector is connected to said at least one second connector;
    wherein said second distance is at least about 0.4 inches;
    wherein said at least I/O connector is hermetic;
    wherein said at least I/O connector includes at least about 250 electrical conductors;
    an enclosure capable of receiving said I/O board, said transition board and said backplane board, wherein said enclosure is comprised of a spray cooling system.

* * * * *